(12) United States Patent
Park

(10) Patent No.: US 7,413,921 B2
(45) Date of Patent: Aug. 19, 2008

(54) METHOD OF MANUFACTURING IMAGE SENSOR

(75) Inventor: Byung-Jun Park, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 298 days.

(21) Appl. No.: 11/410,650

(22) Filed: Apr. 25, 2006

(65) Prior Publication Data

US 2006/0281276 A1  Dec. 14, 2006

(30) Foreign Application Priority Data

Jun. 10, 2005  (KR) .................... 10-2005-0049714

(51) Int. Cl.
 *H01L 21/00* (2006.01)
 *H01L 31/62* (2006.01)

(52) U.S. Cl. ........................ 438/57; 257/292

(58) Field of Classification Search .................. 438/57, 438/196, 218, 223, 228, 298; 257/233, 292
See application file for complete search history.

(56) References Cited

U.S. PATENT DOCUMENTS

| | | | | |
|---|---|---|---|---|
| 6,417,023 | B2 | 7/2002 | Suzuki et al. | 438/73 |
| 6,472,245 | B2 * | 10/2002 | Lee | 438/59 |
| 6,734,471 | B2 * | 5/2004 | Kim | 257/184 |
| 7,224,011 | B2 * | 5/2007 | Jang | 257/292 |

FOREIGN PATENT DOCUMENTS

| | | |
|---|---|---|
| KR | 2003-0052639 | 6/2003 |
| KR | 10-2004-0008912 | 1/2004 |
| KR | 10-2005-0042910 | 11/2005 |

OTHER PUBLICATIONS

Patent Abstracts of Japan Publication No. 11-353889.
Patent Abstracts of Japan Publication No. 2002-318265.
Korean Intellectual Property Office Korean Patent Abstracts Publication No. 10-0425440.

* cited by examiner

*Primary Examiner*—Calvin Lee
(74) *Attorney, Agent, or Firm*—F. Chau & Associates, LLC

(57) ABSTRACT

A method of manufacturing an image sensor comprises forming an isolation layer defining an active region in a semiconductor substrate using a first mask pattern formed on the semiconductor substrate, forming a first ion implantation mask pattern by reducing a width of the first mask pattern to expose an edge portion of the active region around the isolation layer, forming a first hole accumulation region by implanting a first conductive type of impurity ions into the edge portion of the active region using the first ion implantation mask pattern, forming a second ion implantation mask pattern covering the isolation layer and the first hole accumulation region, and forming a photodiode by implanting a second conductive type of impurity ions into a region of the semiconductor substrate using the second ion implantation mask pattern, wherein at least a portion of the region is surrounded by the first hole accumulation region in the active region.

20 Claims, 9 Drawing Sheets

METHOD OF MANUFACTURING IMAGE SENSOR

CROSS-REFERENCE TO RELATED PATENT APPLICATION

This application claims priority to Korean Patent Application No. 10-2005-0049714, filed on Jun. 10, 2005, the disclosure of which is incorporated herein in its entirety by reference.

BACKGROUND OF THE INVENTION

1. Technical Field

The present disclosure relates to a method of manufacturing an image sensor for converting optical images to electric signals, and more particularly, to a method of manufacturing an image sensor having a reduced dark current in a photodiode.

2. Discussion of the Related Art

A photodiode is used for an image sensor to convert incident light to charges. Image sensors such as, for example, a complimentary metal oxide semiconductor (CMOS) image sensor (CIS) and a charge coupled device (CCD) image sensor are widely used. In the CIS and the CCD image sensors, incident light on a two-dimensionally disposed photodiode is converted to signal charges (i.e., electrons) which are sequentially read by signal voltages in accordance with a time axis. The CIS and CCD image sensor can have similar structural configurations. In the CIS image sensor, charges are converted to voltages in a plurality of unit pixels, and signals are output by a switching operation in a signal line. In the CCD image sensor, signal charges are transferred by the order of a vertical register and a horizontal register, and the signal charges are converted to voltages before an output terminal.

In conventional image sensors, a charge transfer efficiency and a charge accumulation capability are decreased due to noise or dark current, thereby causing image defects. The dark current refers to charges stored in a photosensitive element of the image sensor without an input of light. The dark current can be caused by defects existing at an interface portion between an isolation layer around a photodiode and an active region. The dark current can also be caused by a silicon dangling bond. The silicon dangling bond is located, for example, around side-portions of the photodiode or adjacent to a silicon substrate surface or an isolation layer, and may easily generate charges without the input of light. Hence, dangling bonds existing around side-portions of the photodiode may generate signal charges even if light is not incident, thereby causing a dark current. Since the dark current is generated due to a crystal combination, an amount of the generated dark current is varied in accordance with each photodiode. Thus, when an image sensor reacts due to the dark current, the quality of image in a display device using the image sensor can be deteriorated.

A conventional technology for minimizing the dark current generated around the side-portions of the photodiode forms a hole accumulation region. The hole accumulation region can be formed by implanting p-type impurity ions into an active region formed between an isolation layer and a photodiode using a photoresist pattern formed by a photolithography process using an ion implantation mask. However, in the conventional method, if a substrate area opened by the photoresist pattern is increased, a photodiode region and an active region formed between an isolation layer and a photodiode are also opened. Thus, an effective area of the photodiode and a saturated current are reduced, thereby causing a deterioration of photosensitivity. The deterioration of photosensitivity can be prevented by minimizing the substrate area opened by the photoresist pattern. The conventional method using the photolithography process causes misalignment of a photoresist pattern or causes a critical dimension (CD) deviation on a wafer. The conventional method using the photolithography process has a difficulty in forming a photoresist pattern having a vertical profile. Thus, there is a need to ensure both an effective area of the photodiode and a sufficient process margin during the photolithography process by minimizing the substrate area opened by the photoresist pattern.

SUMMARY OF THE INVENTION

Embodiments of the present invention provide a method of manufacturing an image sensor capable of ensuring an effective area of a photodiode without reducing process margins to be secured for a photolithography process in a scaled-down pixel, and minimizing generation of a dark current around the side portions of a photodiode near an isolation layer.

According to an embodiment of the present invention, a method of manufacturing an image sensor comprises forming an isolation layer defining an active region in a semiconductor substrate using a first mask pattern formed on the semiconductor substrate, forming a first ion implantation mask pattern by reducing a width of the first mask pattern to expose an edge portion of the active region around the isolation layer, forming a first hole accumulation region by implanting a first conductive type of impurity ions into the edge portion of the active region using the first ion implantation mask pattern, forming a second ion implantation mask pattern covering the isolation layer and the first hole accumulation region, and forming a photodiode by implanting a second conductive type of impurity ions into a region of the semiconductor substrate using the second ion implantation mask pattern, wherein at least a portion of the region is surrounded by the first hole accumulation region in the active region.

The second ion implantation mask pattern may be formed to be self-aligned by the first ion implantation mask pattern.

The first ion implantation mask pattern and the second ion implantation mask pattern may comprise different materials.

The first ion implantation mask pattern may comprise silicon nitride and the second ion implantation mask pattern may comprise polysilicon.

The step of forming the isolation layer may comprise forming a trench in the semiconductor substrate by etching the semiconductor substrate using the first mask pattern as an etch mask, filling the inside of the trench with an insulating layer having an upper surface with the same height as that of the first mask pattern, and forming the isolation layer having an upper surface with a height higher than that of an upper surface of the semiconductor substrate by partially removing an upper portion of the insulating layer.

The semiconductor substrate may include an active pixel sensor (APS) region having a plurality of unit pixels including photodiode regions and transistor regions. The step of forming the photodiode may include implanting impurity ions into the photodiode region using a photoresist pattern covering the transistor region and the second ion implantation mask pattern as ion implantation masks.

The method may further include forming a second hole accumulation region disposed from the photodiode along a surface of the semiconductor substrate on the photodiode by implanting a first conductive type of impurity ions into the semiconductor substrate.

The method may further comprise forming a plurality of gates to form a transistor in the transistor region.

The semiconductor substrate may comprise an active pixel sensor (APS) region having a plurality of unit pixels including photodiode regions and transistor regions respectively, and a logic region having read-out circuits.

The method may further include forming a photoresist pattern not to cover the isolation layer and the active region around the isolation layer in the logic region. The step of forming the first hole accumulation region may include implanting impurity ions using the first ion implantation mask pattern and the photoresist pattern as ion implantation masks.

According to another embodiment of the present invention, a method of manufacturing an image sensor comprises preparing a semiconductor substrate including an active pixel sensor region and a logic region, wherein the active pixel sensor region includes a plurality of unit pixels comprising photodiode regions and transistor regions, and the logic region includes read-out circuits, forming an isolation layer defining an active region in the active pixel sensor region and the logic region using a first mask pattern formed on the active pixel sensor region and the logic region, forming a first ion implantation mask pattern by reducing a width of the first mask pattern to expose an edge portion of the active region around the isolation layer in the active pixel sensor region and the logic region, forming a first hole accumulation region by implanting a first conductive type of impurity ions into the edge portion of the active region of the active pixel sensor region using the first ion implantation mask pattern, forming a second ion implantation mask pattern covering the isolation layer and the first hole accumulation region in the active pixel sensor region, and forming a photodiode by implanting a second conductive type of impurity ions into a region of the semiconductor substrate using the second ion implantation mask pattern, wherein at least a portion of the region is surrounded by the first hole accumulation region in the active region of the active pixel sensor region.

BRIEF DESCRIPTION OF THE DRAWINGS

Exemplary embodiments of the present invention can be understood in more detail from the following description taken in conjunction with the accompanying drawings in which.

DETAILED DESCRIPTION OF EXEMPLARY EMBODIMENTS

Exemplary embodiments of the present invention are more fully described below with reference to the accompanying drawings. The present invention may be embodied in many different forms and should not be construed as limited to the embodiments set forth herein.

Figure 1:
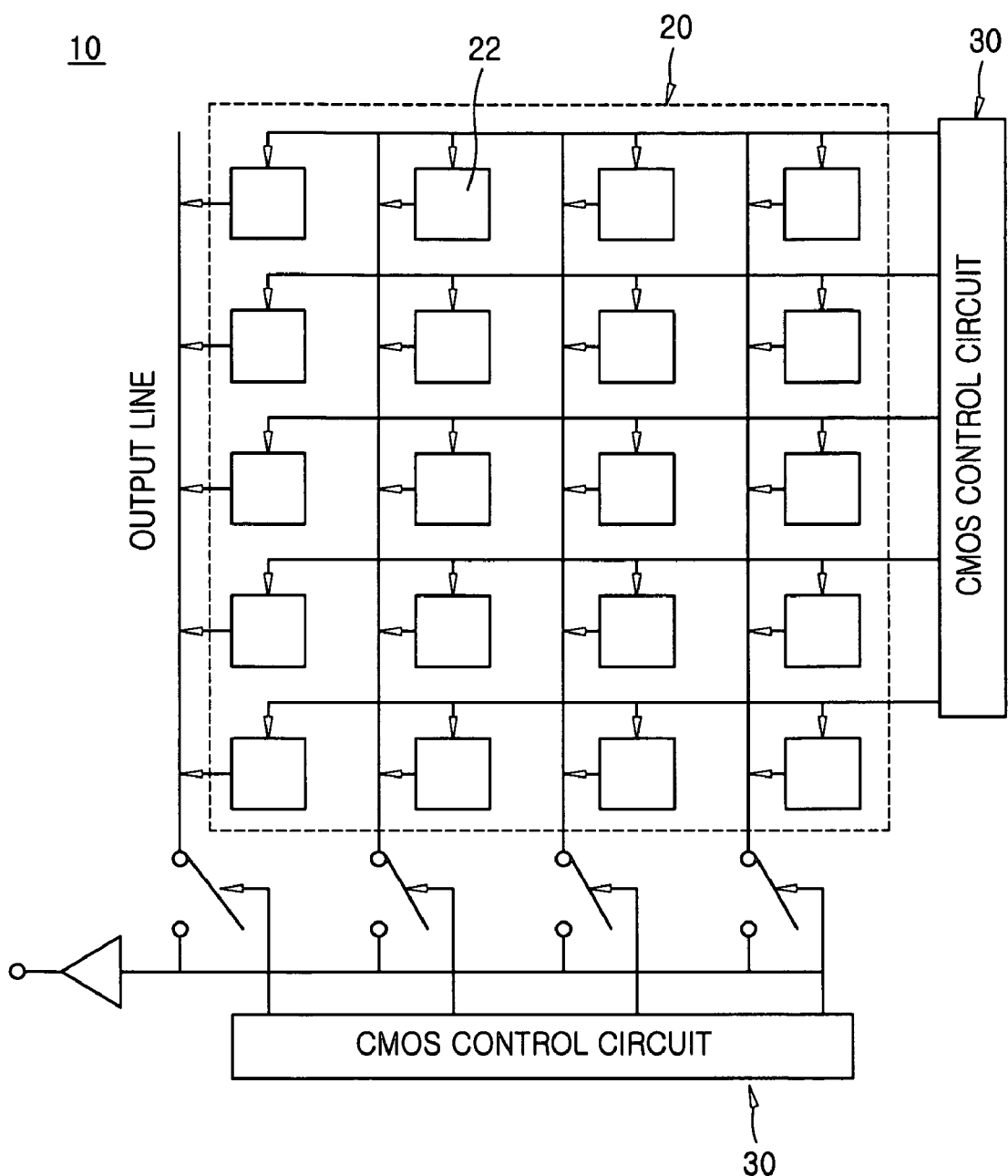
FIG. 1 is a diagram schematically illustrating a CMOS image sensor (CIS) manufactured according to an embodiment of the present invention.

FIG. 1 is a diagram schematically illustrating a CMOS image sensor (CIS) manufactured according to an embodiment of the present invention.

Referring to FIG. 1, a CIS 10 includes a pixel array region 20 formed on a circuit substrate and a CMOS control circuit 30. The pixel array region 20 includes a plurality of unit pixels 22 aligned in a matrix shape. The CMOS control circuit 30 disposed around the pixel array region 20 comprises a plurality of CMOS transistors (not shown). The CMOS control circuit 30 supplies a predetermined signal to each unit pixel 22 of the pixel array region 20 or controls an output signal.

One through five transistors can be used in the unit pixel 22 according to an embodiment of the present invention.

Figure 2:
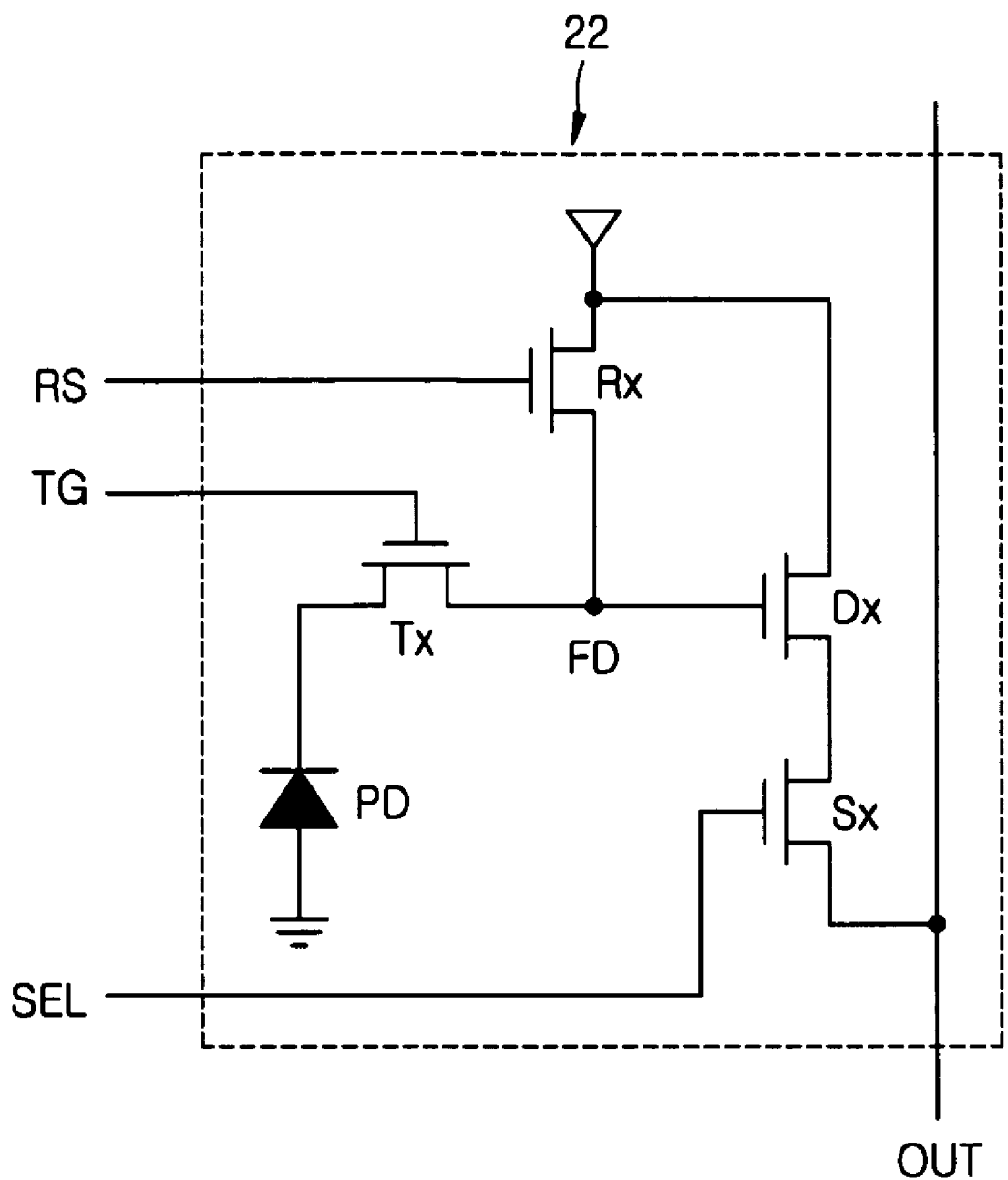
FIG. 2 is a circuit diagram of a unit pixel in the CIS of FIG. 1 according to an embodiment of the present invention.

FIG. 2 is a circuit diagram of the CIS unit pixel 22 according to an embodiment of the present invention. The unit pixel 22 comprises, for example, one photodiode and four transistors.

Referring to FIG. 2, the unit pixel 22 includes a photodiode PD receiving light and generating photocharge, a transfer transistor Tx transferring a signal charge generated from the photodiode PD to a floating diffusion region FD, a reset transistor Rx periodically resetting the charges stored in the floating diffusion region FD, a drive transistor Dx functioning as a source follower buffer amplifier, and buffering a signal in accordance with the charges stored in the floating diffusion region FD, and a select transistor Sx switching and addressing for selecting the unit pixel 22. In FIG. 2, "RS" is a signal applied to a gate of the reset transistor Rx, and "TG" is a signal applied to a gate of the transfer transistor Tx.

Figure 3:
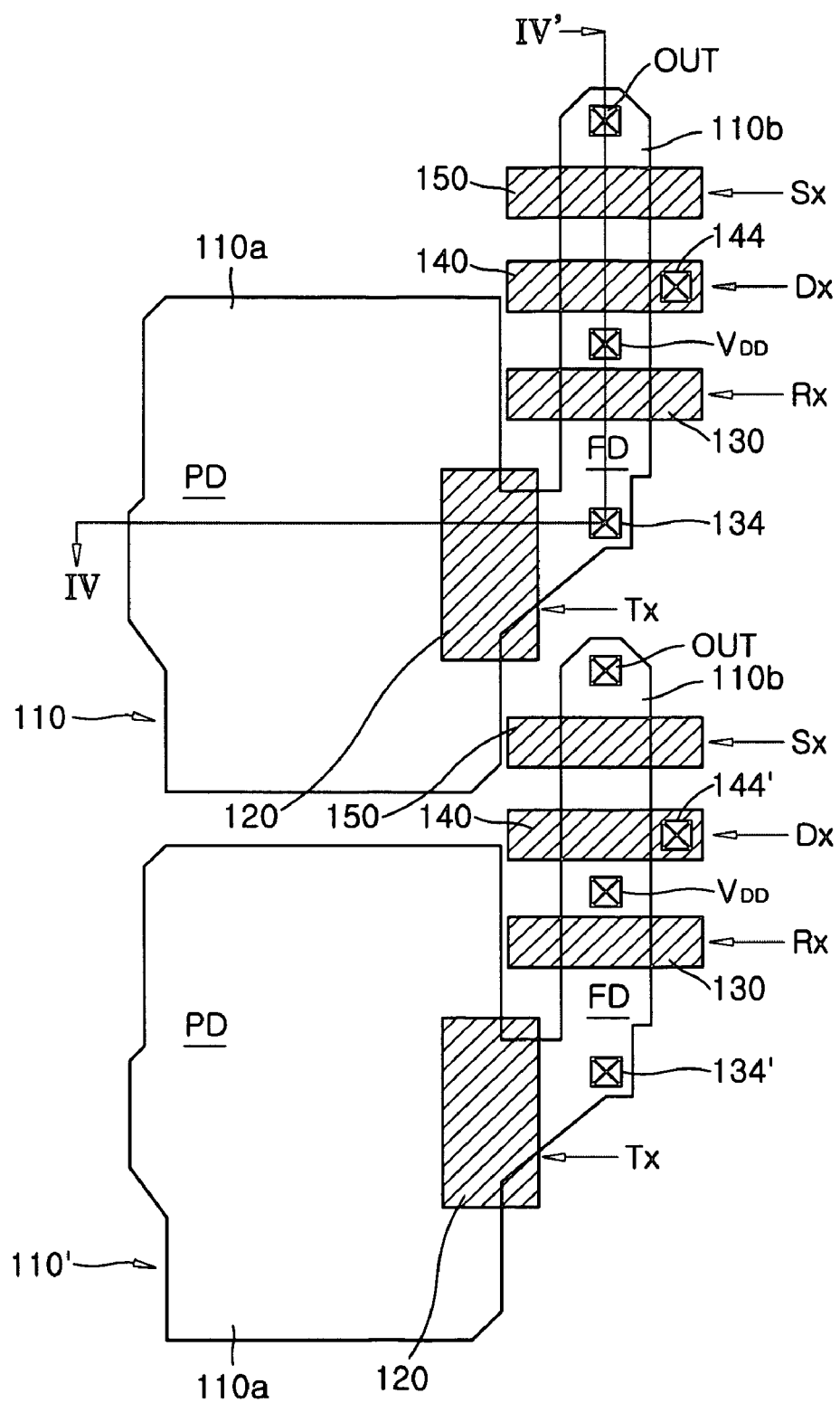
FIG. 3 is a schematic layout of unit pixels according to an embodiment of the present invention.

FIG. 3 is a schematic layout of two neighboring unit pixels according to an embodiment of the present invention.

Referring to FIG. 3, the unit pixel of the CIS includes active regions 110, 110' defined with a predetermined shape in a pixel array region on a semiconductor substrate. The active regions 110, 110' are respectively divided into a photodiode region 110a in which the photodiode PD is formed, and a transistor region 110b in which a transistor is formed. In the active regions 110, 110', the photodiode region 110a as a light-receiving region may be formed with a predetermined shape such as, for example, a rectangular shape in a plan view. The transistor region 110b may be formed with a line shape partially contacting with a part of the photodiode region 110a. The transistor region 110b is bent in at least one portion.

A gate 120 of the transfer transistor Tx is disposed near the interface between the photodiode region 110a and the transistor region 110b. The transfer transistor Tx transfers charges stored in the photodiode PD to the floating diffusion region FD.

A gate 130 of the reset transistor Rx, a gate 140 of the drive transistor Dx, and a gate 150 of the select transistor Sx are disposed spaced apart from each other at a predetermined distance in the transistor region 110b. The sequence of the transistors Sx, Dx, and Rx may be changed according to embodiments of the present invention.

An active region between the gate 120 of the transfer transistor Tx and the gate 130 of the reset transistor Rx constitutes the floating diffusion region FD. The floating diffusion region FD stores the charges transferred from the photodiode PD, and the reset transistor Rx periodically resets the floating diffusion region FD. The drive transistor Dx buffers a signal depending on charges stored in the floating diffusion region FD.

A power supply terminal $V_{DD}$ is connected to a source of the reset transistor Rx. If a reset signal RS (refer to FIG. 2) is applied to the gate 130 of the reset transistor Rx, the reset transistor Rx is turned on, and a potential of the floating diffusion region FD is charged by a $V_{DD}$ voltage from the source of the reset transistor Rx. Thus, the floating diffusion region FD is reset to a predetermined voltage (i.e., $V_{DD}$–Vth, where Vth is a threshold voltage of the reset transistor).

The charge of the floating diffusion region FD is applied to the gate 140 of the drive transistor Dx through an interconnection (not shown) connecting a contact 134 and a contact 144. The charge of the floating diffusion region FD controls the current flowing through the select transistor Sx turned on by a select signal SEL applied to the gate 150 of the select transistor Sx. According to an embodiment of the present invention, the interconnection connecting the contact 134 and the contact 144 is formed to have a short path to prevent the decrease of a conversion efficiency due to the increase of a capacitance in a conductive layer constituting the interconnection. In forming the interconnection, the contact 134 may be connected to another contact 144' disposed in another active region 110' according to an embodiment of the present invention. The current flowing through the select transistor Sx is output as an output signal of a unit pixel from an output terminal OUT of the unit pixel, and is read out by a load transistor (not shown) connected to the output terminal OUT of the unit pixel.

If light is incident on the photodiode PD, the photodiode PD generates an electron-hole pair (EHP) in proportion to a measured amount of incident light. A potential of a source node of the transfer transistor Tx is changed by the generated signal charges in proportion to an amount of the signal charges. The signal charges generated from the photodiode PD are bound to the photodiode PD by a gate barrier of the transfer transistor Tx.

If a voltage TG pulse similar to a reset voltage RS is applied to the gate 120 of the transfer transistor Tx, the transfer transistor Tx is turned on with the reset transistor Rx in an off-state. Then, the signal charges stored in the photodiode PD are transferred to the floating diffusion region FD. A potential of the floating diffusion region FD and a gate bias of the select transistor Sx are concurrently changed in proportion to an amount of the transferred signal charges. When the potential of the floating diffusion region FD is changed as described above, a source potential of the select transistor Sx is changed. The current flowing through the select transistor Sx is output as a new output voltage at the output terminal OUT of a unit pixel.

Then, if the reset transistor Rx is turned on again, a potential of the floating diffusion region FD is charged into a $V_{DD}$ voltage. When the procedure as above is repeated, the output signal change of the output terminal OUT is read out.

FIGS. 4A through 4J are sectional views illustrating a method of manufacturing an image sensor according to an embodiment of the present invention. FIGS. 4A through 4J are sectional views taken along the line corresponding to IV-IV' of FIG. 3.

Figure 4A:
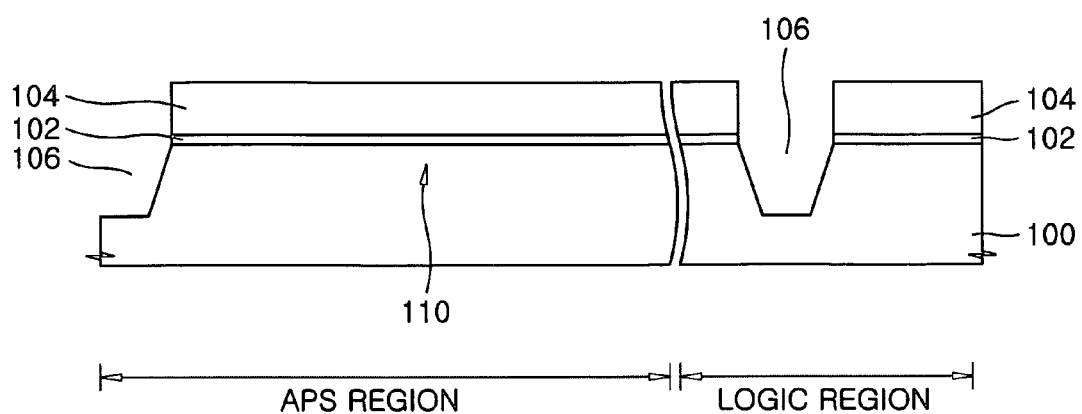
FIGS. 4A through 4J are sectional views illustrating a method of manufacturing an image sensor according to an embodiment of the present invention.

Referring to FIG. 4A, a semiconductor substrate 100 includes an active pixel sensor (APS) region having a plurality of unit pixels and a logic region having a read-out circuit. Each unit pixel includes a photodiode region and a transistor region. A hard mask is formed on the semiconductor substrate 100. The hard mask has, for example, a stack structure, in which a pad oxide layer 102 and a nitride layer 104 are formed. An active region is defined in the semiconductor substrate 100 by the hard mask. The semiconductor substrate 100 is etched to a predetermined depth using the hard mask as an etch mask, thereby forming a trench 106. The active region of the semiconductor substrate 100 is confined by the trench 106. A nitride layer 104 of the hard mask is used as an ion implantation mask during a subsequent ion implantation process, and can be formed with a relatively small thickness of about 700 Å through about 800 Å.

Figure 4B:
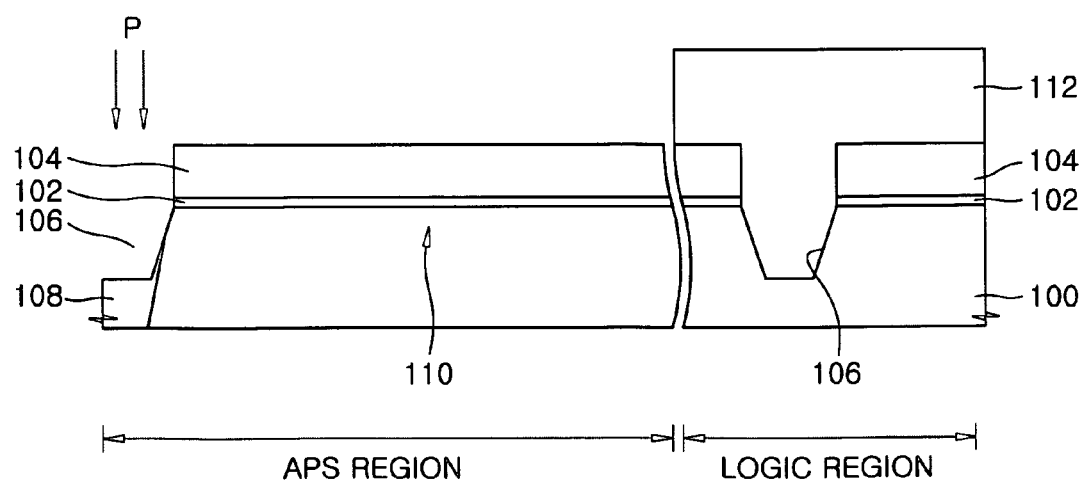

Referring to FIG. 4B, p-type impurity ions are selectively implanted into the trench 106 of the APS region, using a first photoresist pattern 112 as an ion implantation mask, thereby forming an ion implantation region 108 for field isolation below the trench 106.

Figure 4C:
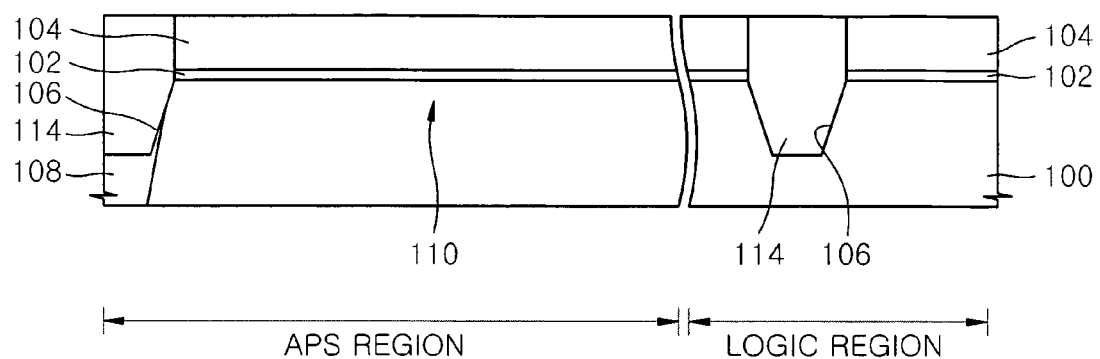

Referring to FIG. 4C, after the first photoresist pattern 112 is removed, and an oxide layer 114, for example, a high density plasma (HDP) oxide layer, is deposited to fill the trench 106, a planarization process using, for example, a chemical mechanical polishing (CMP) process is performed until an upper surface of the nitride layer 104 is exposed.

Figure 4D:
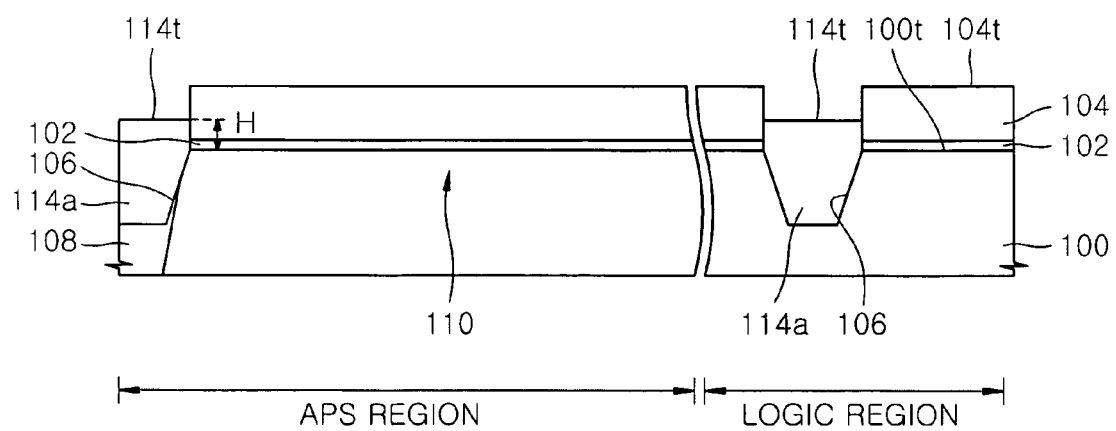

Referring to FIG. 4D, the oxide layer 114 surrounded by the nitride layer 104 is etched back, thereby forming an isolation layer 114a having an upper surface 114t. The upper surface 114t is formed lower than an upper surface 104t of the nitride layer 104 and is formed higher than an upper surface 100t of the semiconductor substrate 100. The upper surface 114t of the isolation layer 114a is formed higher than the upper surface 100t of the semiconductor substrate 100 by a thickness H of about 100 Å through about 900 Å. According to an embodiment of the present invention, the thickness H is about 100 Å through about 600 Å. The upper surface 114t of the isolation layer 114a is formed higher than the upper surface 100t of the semiconductor substrate 100 because a thickness of the isolation layer 114a can be removed through repeatedly performed cleaning operations during subsequent processes.

Figure 4E:
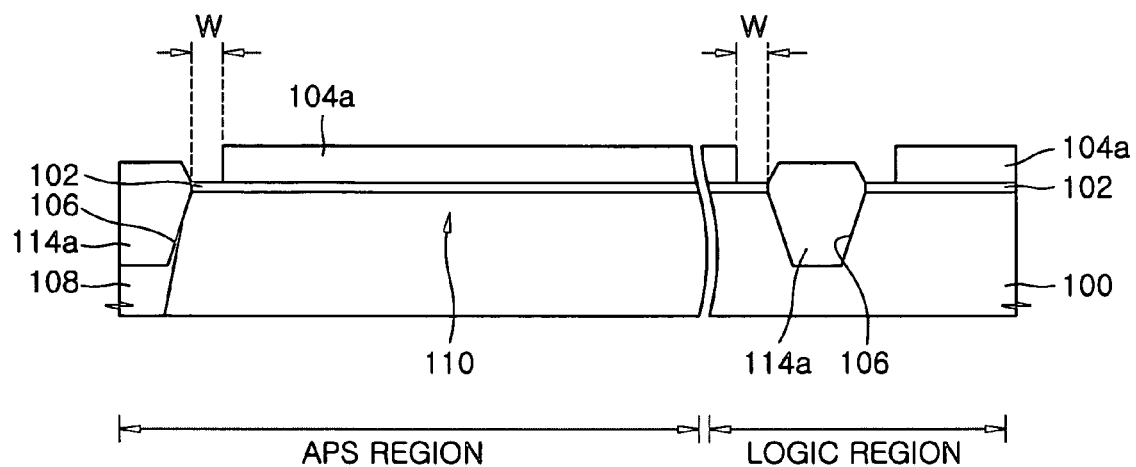

Referring to FIG. 4E, the nitride layer 104 is isotropically wet-etched under the etch condition of an etch selectivity with respect to the oxide layer and the silicon material on the semiconductor substrate 100. At this time, an etch solution such as, for example, phosphoric acid may be used. A predetermined amount of sidewall and an upper surface of the nitride layer 104 are removed by the isotropic wet etching, and a predetermined width W portion of the nitride layer 104 adjacent to the isolation layer 114a of the active region 110 is removed thereby forming a first ion implantation mask pattern 104a being composed of a portion of the remaining nitride layer 104. An edge portion of a region where the photodiode PD will be formed around the first ion implantation mask pattern 104a is exposed about as much or as much as the width W. The width W is about equal to or equal the size of a width of a predetermined ion implantation region. The ion implantation region can be formed to eliminate a dark current between the photodiode PD (FIG. 3) and the isolation layer 114a adjacent to the photodiode PD.

Figure 5:
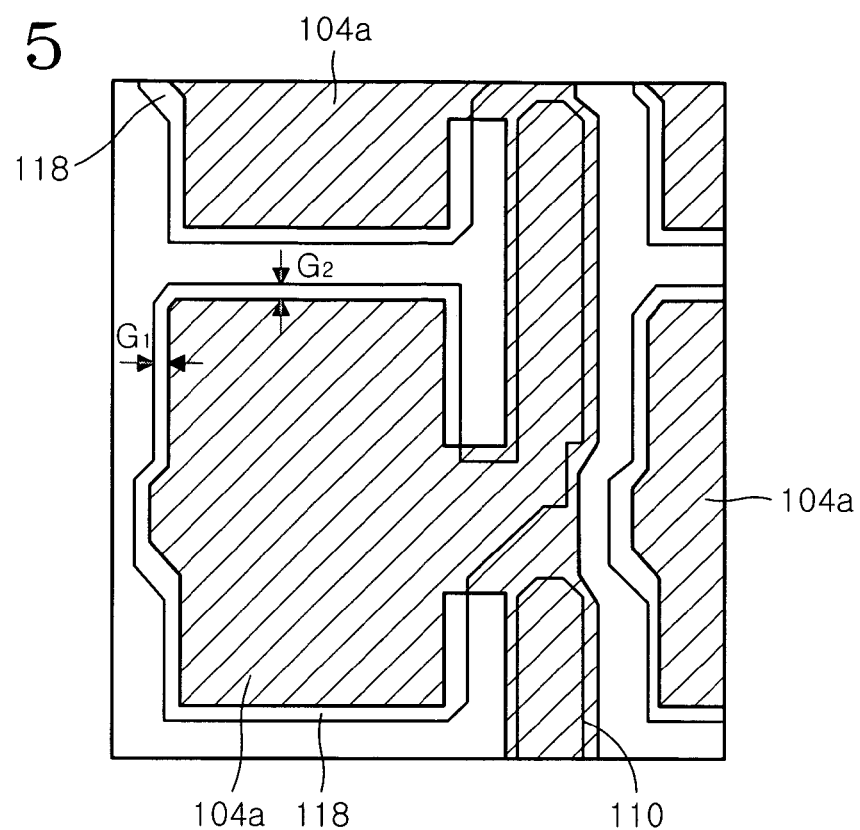
FIG. 5 is a plan view illustrating an active region formed in a semiconductor substrate and a first ion implantation mask pattern covering the active region according to an embodiment of the present invention.

FIG. 5 illustrates a planar layout including the active regions 110, which are repeatedly formed inside predetermined regions of the semiconductor substrate 100, and the first ion implantation mask pattern 104a covering the active regions 110.

Figure 4F:
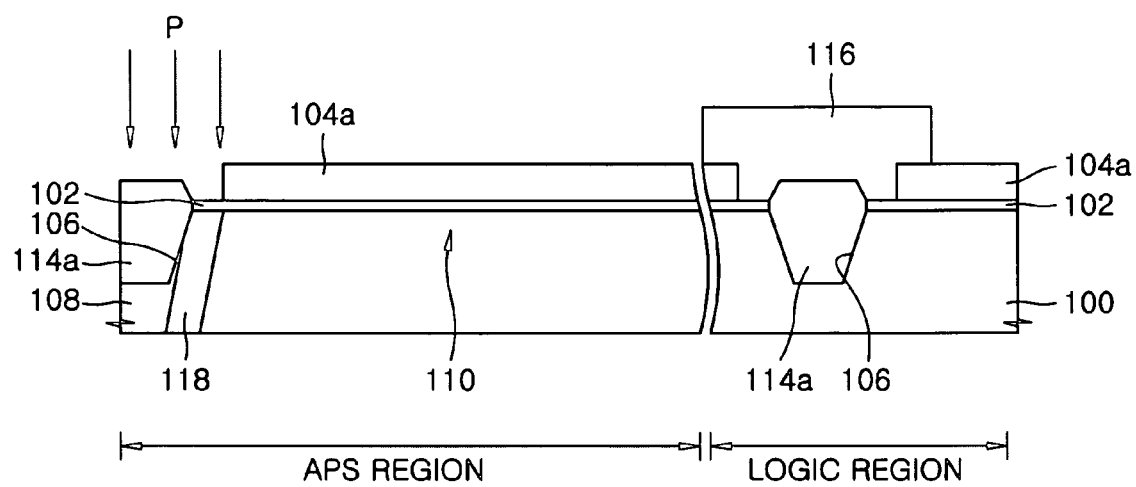

Referring to FIG. 4F, a second photoresist pattern 116 is formed to cover, for example, the isolation layer 114a in the logic region of the semiconductor substrate 100 and the active region around the isolation layer 114a. The second photoresist pattern 116 is formed on the first ion implantation mask pattern 104a. Then, p-type impurity ions are implanted into the edge portions of the active region 110 around and in contact with the isolation layer 114a in the APS region. The p-type impurity ions are implanted using the first ion implantation mask pattern 104a and the second photoresist pattern 116 as ion implantation masks, thereby forming a first hole accumulation region 118 between the predetermined photodiode PD region in the edge portions of the active region 110 and the isolation layer 114a. P-type impurity such as, for example, B or $BF_2$ ions can be used.

In FIG. 5, the region extending from the edge portion of the active region 110 with a width of $G_1$ and a width of $G_2$ but not covered with the first ion implantation mask pattern 104a is the first hole accumulation region 118. The first hole accumulation region 118 can minimize a dark current that can be generated due to, for example, silicon dangling bond or crystal defects at the boundary of the photodiode, that is, adjacent to the isolation layer 114a. That is, the holes among the electron-hole pairs thermally generated from the silicon dangling bonds adjacent to the isolation layer 114a are diffused into the substrate grounded through the first hole accumulation region 118, and the electrons are recombined with holes during the diffusion toward the first hole accumulation region 118 and disappeared. Thus, the thermally generated electrons stored in the n-type photodiode can be reduced. Thus, the dark current can be minimized.

Figure 4G:
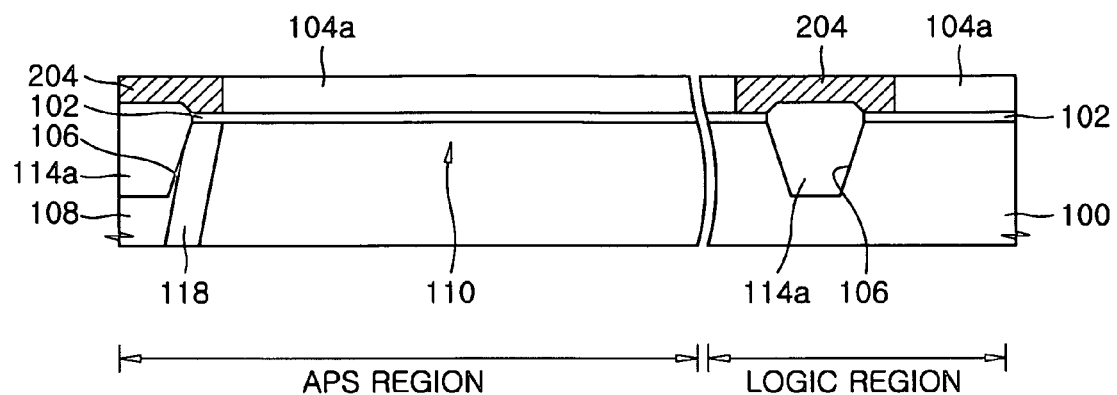

Referring to FIG. 4G, the second photoresist pattern 116 is removed. The height of the isolation layer 114a is gradually reduced through a cleaning process after the ion implantation and a cleaning process after the removal of the second photoresist pattern 116.

A material having an etch selectivity with respect to the oxide layer and the nitride layer for a specific etch solution, for example, polysilicon, is deposited on the overall surface of the semiconductor substrate 100 having the first ion implantation mask pattern 104a. Thereafter, the structure is planarized using, for example, a CMP process until the upper surface of the first ion implantation mask pattern 104a is exposed, thereby forming a second ion implantation mask pattern 204 covering a portion exposed through the first ion implantation mask pattern 104a. As a result, the second ion implantation mask pattern 204 is self-aligned by the first ion implantation mask pattern 104a and is formed to cover both the isolation layer 114a adjacent to the photodiode PD region and the first hole accumulation region 118.

Figure 4H:
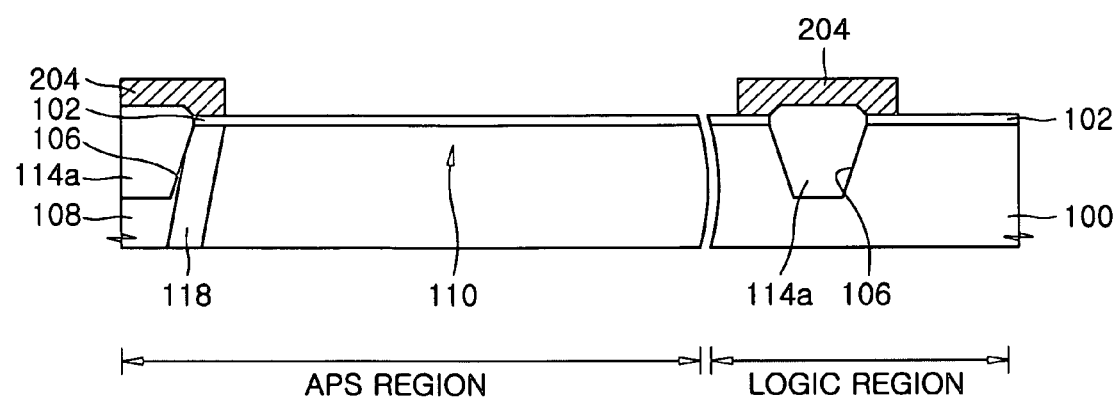

Referring to FIG. 4H, the first ion implantation mask pattern 104a is selectively removed. To selectively remove the first ion implantation mask pattern 104a, a wet etch process using, for example, a phosphoric acid solution may be performed.

Figure 4I:
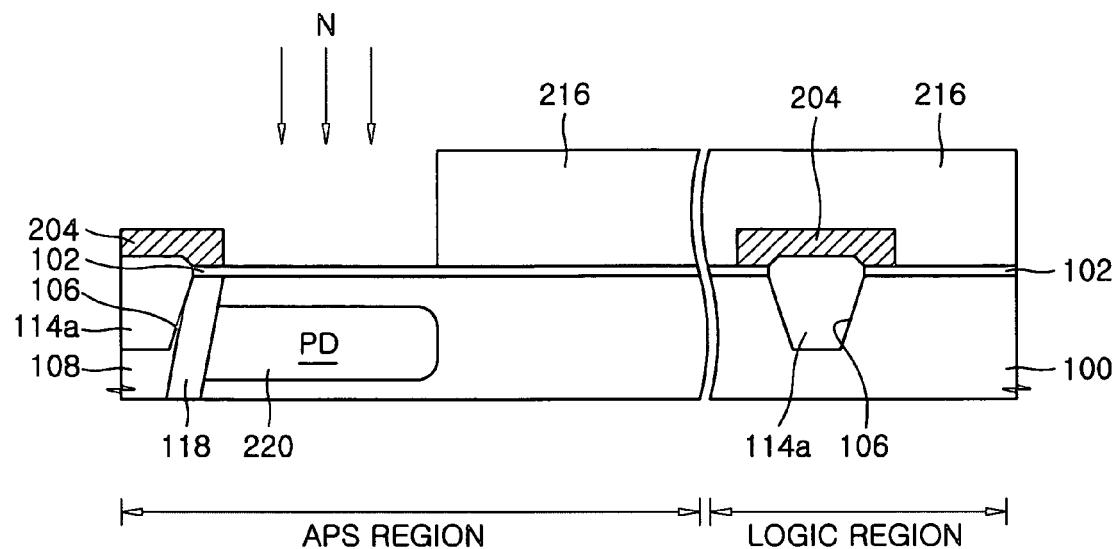

Referring to FIG. 4I, a third photoresist pattern 216 is formed to cover the logic region of the semiconductor substrate 100 and the transistor region in the APS region. That is, the predetermined photodiode PD region and the region adjacent to the photodiode PD region where the isolation layer 114a is formed are not covered with the third photoresist pattern 216.

N-type impurity ions are implanted into the predetermined photodiode PD region of the semiconductor substrate 100, using the third photoresist pattern 216 and the second ion implantation mask pattern 204 as ion implantation masks, thereby forming a photodiode 220. The n-type impurity such as, for example, As ions can be used.

Figure 6:
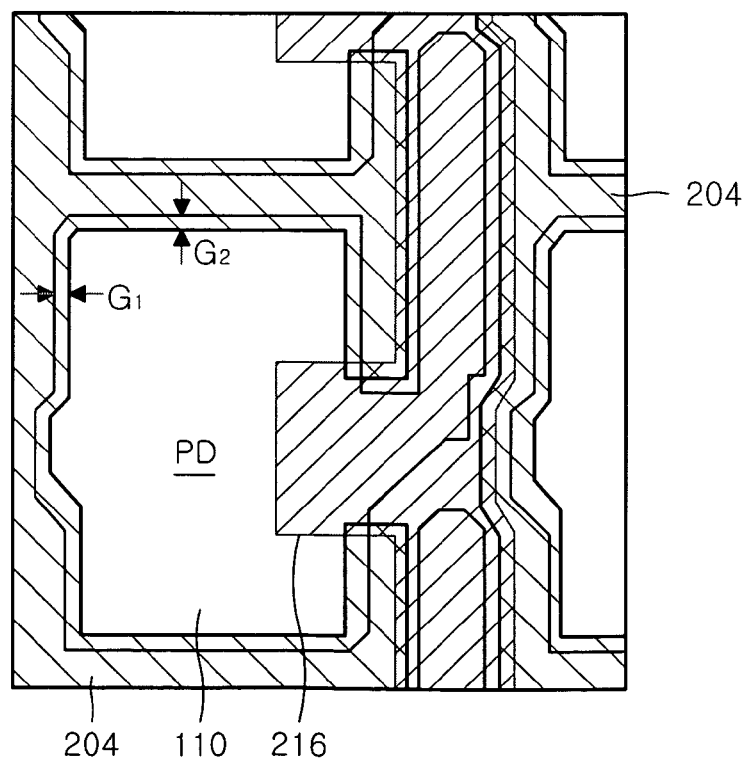
FIG. 6 is a plan view illustrating the active region formed in the semiconductor substrate, a second ion implantation mask pattern and a third photoresist pattern covering the active region according to an embodiment of the present invention.

FIG. 6 is a plan view illustrating active regions 110 repeatedly formed in predetermined regions of the semiconductor substrate 100, and a second ion implantation mask pattern 204 and a third photoresist pattern 216 covering the active regions 110. In FIG. 6, the region extending from the edge portion of the active region 110 with a width of $G_1$ and a width of $G_2$ but not covered with the first ion implantation mask pattern 104a is the first hole accumulation region 118.

Figure 4J:
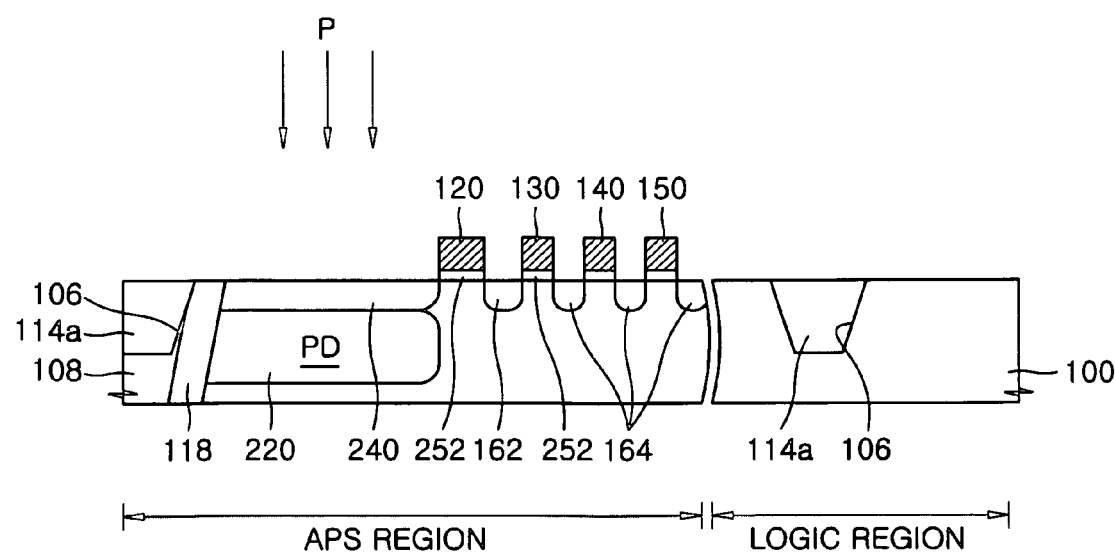

Referring to FIG. 4J, the third photoresist pattern 216 and the second ion implantation mask pattern 204 are removed. A known ashing or a known stripping process may be used to remove the third photoresist pattern 216. A chemical dry etching (CDE) process may be performed under the condition of an etch selectivity with respect to an oxide layer to remove the second ion implantation mask pattern 204.

Then, after the pad oxide layer 102 is removed, a gate insulating layer 252 and a conductive layer are sequentially stacked on the semiconductor substrate 100, and then, patterned, thereby forming a plurality of gates 120, 130, 140, 150. The plurality of gates 120, 130, 140 and 150 can be used to constitute a unit pixel 22 (FIG. 2) in the transistor region of the APS region. Then, p-type impurities are implanted into the photodiode PD region using a predetermined photoresist pattern (not shown) exposing only the photodiode PD region on the semiconductor substrate 100 as an ion implantation mask, thereby forming a second hole accumulation region 240 disposed on the photodiode 220 along the surface of the semiconductor substrate 100. During the ion implantation to form the second hole accumulation region 240, for example, B or $BF_2$ ions may be used according to an embodiment of the present invention. The presence of second hole accumulation region 240 can minimize a dark current generated due to silicon dangling bond or crystal defects near the surface of the semiconductor substrate 100 in the photodiode region.

Ion implantation processes of forming, for example, various wells (not shown), an impurity diffusion region 162, and source/drain regions 164 used to form each transistor including the plurality of gates 120, 130, 140, 150 in the transistor region of the APS region of the semiconductor substrate 100 may employ typical ion implantation processes. Then, interconnection formation processes are performed using a known method, thereby forming the CIS.

As described above, in the formation of the first hole accumulation region 118 at the edge portions of the active region 110 between the isolation layer 114a and the photodiode 220 according to embodiments of the present invention, a photolithography process, which may be adversely affected by process parameters such as, for example, CD deviation, sidewall profile failure of patterns, and misalignment, is not used. That is, in manufacturing an image sensor according to an embodiment of the present invention, the first ion implantation mask pattern 104a achieved from the hard mask used during the formation of the isolation layer 114a defining the active region 110 is used as an ion implantation mask to form the first hole accumulation region 118 at the edge portion of the active region 110 between the isolation layer 114a and the photodiode 220. Further, the second ion implantation mask pattern 204 formed to be self-aligned by the first ion implantation mask pattern 104a is used as an ion implantation mask during the ion implantation process of forming the photodiode 220 surrounded by the first hole accumulation region 118 in the active region 110. Thus, even when the first hole accumulation region 118 is formed to have a minimized area/size without sufficient process margins as a result of high scaling, component elements can be formed at correct locations in accordance with a process design.

A method of manufacturing an image sensor according to an embodiment of the present invention can be also employed for manufacturing image sensors other than CIS, such as, for example, a CCD image sensor.

That is, when an isolation layer is formed at the boundary of a photodiode in a CCD image sensor, an ion implantation process of forming a hole accumulation region at the edge portion of an active region in a photodiode region, and an ion implantation process of forming a photodiode surrounded by the hole accumulation region can be performed similarly to the processes described above without departing from the spirit of the present invention.

As described above, in the method of manufacturing an image sensor according to an embodiment of the present invention, a first conductive type of impurity ions are selectively implanted into the edge portion of the active region, using the first ion implantation mask pattern as a portion of the hard mask used to form the isolation layer defining the active region of the semiconductor substrate, thereby forming the first hole accumulation region. Then, a second conductive type of impurity ions are selectively implanted into the region, at least a portion of which is surrounded by the first hole accumulation region, using the second ion implantation mask pattern formed to be self-aligned with respect to the first ion implantation mask pattern, thereby forming the photodiode.

Thus, when the first hole accumulation region 118 is formed to have a minimized area/size without sufficient process margins as a result of high scaling, component elements can be formed at correct locations in accordance with a process design. Therefore, in the formation of a highly-integrated image sensor without a sufficient process margin, an effective area of the photodiode can be ensured, and image defects caused by the generation of a dark current at the boundary of the photodiode can be minimized.

Although the exemplary embodiments of the present invention have been described with reference to the accompanying drawings, it is to be understood that the present invention should not be limited these precise embodiments but various changes and modification can be made by one ordinary skill in the art without departing from the spirit and scope of the present invention. All such changes and modification are intended to be included with the scope of the invention as defined by the appended claims.

What is claimed is:

1. A method of manufacturing an image sensor, the method comprising:
   forming an isolation layer defining an active region in a semiconductor substrate using a first mask pattern formed on the semiconductor substrate;
   forming a first ion implantation mask pattern by reducing a width of the first mask pattern to expose an edge portion of the active region around the isolation layer;
   forming a first hole accumulation region by implanting a first conductive type of impurity ions into the edge portion of the active region using the first ion implantation mask pattern;
   forming a second ion implantation mask pattern covering the isolation layer and the first hole accumulation region; and
   forming a photodiode by implanting a second conductive type of impurity ions into a region of the semiconductor substrate using the second ion implantation mask pattern, wherein at least a portion of the region is surrounded by the first hole accumulation region in the active region.

2. The method according to claim 1, wherein the second ion implantation mask pattern is formed to be self-aligned by the first ion implantation mask pattern.

3. The method according to claim 1, wherein the first ion implantation mask pattern and the second ion implantation mask pattern comprise different materials.

4. The method according to claim 1, wherein the first ion implantation mask pattern comprises silicon nitride, and the second ion implantation mask pattern comprises polysilicon.

5. The method according to claim 1, wherein the step of forming the isolation layer comprises:
   forming a trench in the semiconductor substrate by etching the semiconductor substrate using the first mask pattern as an etch mask;
   filling the inside of the trench with an insulating layer having an upper surface with the same height as that of the first mask pattern; and
   forming the isolation layer having an upper surface with a height higher than that of an upper surface of the semiconductor substrate by partially removing an upper portion of the insulating layer.

6. The method according to claim 1, wherein the semiconductor substrate comprises an active pixel sensor region having a plurality of unit pixels including photodiode regions and transistor regions; and
   the step of forming the photodiode includes implanting impurity ions into the photodiode region using a photoresist pattern covering the transistor region and the second ion implantation mask pattern as ion implantation masks.

7. The method according to claim 6, further comprising forming a plurality of gates to form a transistor in the transistor region.

8. The method according to claim 1, further comprising forming a second hole accumulation region disposed along a surface of the semiconductor substrate and on the photodiode by implanting a first conductive type of impurity ions into the semiconductor substrate.

9. The method according to claim 1, wherein:
   the semiconductor substrate comprises an active pixel sensor region having a plurality of unit pixels including photodiode regions and transistor regions, and a logic region having read-out circuits;
   a photoresist pattern is formed to cover the isolation layer and the active region around the isolation layer in the logic region; and
   the step of forming the first hole accumulation region includes implanting impurity ions using the first ion implantation mask pattern and the photoresist pattern as ion implantation masks.

10. The method according to claim 9, wherein the photoresist pattern is formed on the first ion implantation mask pattern.

11. A method of manufacturing an image sensor, the method comprising:
   preparing a semiconductor substrate including an active pixel sensor region and a logic region, wherein the active pixel sensor region includes a plurality of unit pixels comprising photodiode regions and transistor regions, and the logic region includes read-out circuits;
   forming an isolation layer defining an active region in the active pixel sensor region and the logic region using a first mask pattern formed on the active pixel sensor region and the logic region;
   forming a first ion implantation mask pattern by reducing a width of the first mask pattern to expose an edge portion of the active region around the isolation layer in the active pixel sensor region and the logic region;
   forming a first hole accumulation region by implanting a first conductive type of impurity ions into the edge portion of the active region of the active pixel sensor region using the first ion implantation mask pattern;
   forming a second ion implantation mask pattern covering the isolation layer and the first hole accumulation region in the active pixel sensor region; and
   forming a photodiode by implanting a second conductive type of impurity ions into a region of the semiconductor substrate using the second ion implantation mask pattern, wherein at least a portion of the region is surrounded by the first hole accumulation region in the active region of the active pixel sensor region.

12. The method according to claim 11, wherein the second ion implantation mask pattern is formed in the active pixel sensor region and the logic region; and the second ion implantation mask pattern is formed to be self-aligned by the first ion implantation mask pattern.

13. The method according to claim 11, wherein the first ion implantation mask pattern and the second ion implantation mask pattern comprise different materials.

14. The method according to claim 11, wherein the first ion implantation mask pattern comprises silicon nitride, and the second ion implantation mask pattern comprises polysilicon.

15. The method according to claim 11, wherein the step of forming the isolation layer comprises:

forming a trench in the semiconductor substrate by etching the semiconductor substrate, using the first mask pattern as an etch mask;

filling the inside of the trench with an insulating layer having an upper surface with the same height as that of the first mask pattern; and forming the isolation layer having an upper surface with a height higher than that of an upper surface of the semiconductor substrate, by partially removing an upper portion of the insulating layer.

16. The method according to claim 11, wherein the step of forming the photodiode comprises implanting impurity ions into the photodiode region using a photoresist pattern covering the transistor region and the logic region of the active pixel sensor region and the second ion implantation mask pattern as ion implantation masks.

17. The method according to claim 11, further comprising forming a second hole accumulation region disposed along a surface of the semiconductor substrate and on the photodiode by implanting a first conductive type of impurity ions into the photodiode region of the semiconductor substrate.

18. The method according to claim 11, further comprising forming a plurality of gates to form a transistor in the transistor region of the active pixel sensor region.

19. The method according to claim 11, the method further comprising forming a photoresist pattern to cover the isolation layer and the active region around the isolation layer in the logic region, wherein the step of forming the first hole accumulation region includes implanting impurity ions into the semiconductor substrate using the first ion implantation mask pattern and the photoresist pattern as ion implantation masks.

20. The method according to claim 19, wherein the photoresist pattern is formed on the first ion implantation mask pattern.

* * * * *